US009231328B2

(12) United States Patent
Rathburn

(10) Patent No.: US 9,231,328 B2
(45) **Date of Patent: *Jan. 5, 2016**

(54) RESILIENT CONDUCTIVE ELECTRICAL INTERCONNECT

(75) Inventor: James Rathburn, Mound, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 971 days.

This patent is subject to a terminal disclaimer.

(21) Appl. No.: 13/318,382

(22) PCT Filed: May 27, 2010

(86) PCT No.: PCT/US2010/036313
§ 371 (c)(1),
(2), (4) Date: Nov. 1, 2011

(87) PCT Pub. No.: WO2010/141303
PCT Pub. Date: Dec. 9, 2010

(65) Prior Publication Data

US 2012/0043130 A1 Feb. 23, 2012

Related U.S. Application Data

(60) Provisional application No. 61/183,335, filed on Jun. 2, 2009.

(51) Int. Cl.
*H05K 1/11* (2006.01)
*H05K 1/00* (2006.01)
(Continued)

(52) U.S. Cl.
CPC ........ *H01R 13/2414* (2013.01); *H01R 13/2485* (2013.01); *Y10T 29/49139* (2015.01)

(58) Field of Classification Search
CPC .................................................. H01R 13/2414
USPC ...................... 174/263, 266, 267; 439/66, 91; 228/180.21
See application file for complete search history.

(56) References Cited

U.S. PATENT DOCUMENTS 3,672,986 A 6/1972 Schneble, Jr. et al.
4,188,438 A 2/1980 Burns
(Continued)

FOREIGN PATENT DOCUMENTS

JP 2003/217774 7/2003
WO WO 91/14015 9/1991
(Continued)

OTHER PUBLICATIONS

Definition of "print" from www.thefreedictionary.com, Aug. 13, 2014.*
(Continued)

*Primary Examiner* — Chau N Nguyen
*Assistant Examiner* — Roshn Varghese
(74) *Attorney, Agent, or Firm* — Karl Schwappach

(57) ABSTRACT

An interconnect assembly including a resilient material with a plurality of through holes extending from a first surface to a second surface. A plurality of discrete, free-flowing conductive particles is located in the through holes. The conductive particles are preferably substantially free of non-conductive materials. A plurality of first contact tips are located in the through holes adjacent the first surface and a plurality of second contact tips are located in the through holes adjacent the second surface. The resilient material provides the required resilience, while the conductive particles provide a conductive path substantially free of non-conductive materials.

20 Claims, 8 Drawing Sheets

(51) Int. Cl.

| | |
|---|---|
| ***H05K 7/00*** | (2006.01) |
| ***H01R 4/58*** | (2006.01) |
| ***H01R 12/00*** | (2006.01) |
| ***H01R 13/24*** | (2006.01) |

(56) References Cited

U.S. PATENT DOCUMENTS 4,489,999 A 12/1984 Miniet
4,922,376 A 5/1990 Pommer et al.
4,964,948 A 10/1990 Reed
5,014,159 A 5/1991 Butt
5,071,363 A 12/1991 Reylek et al.
5,072,520 A 12/1991 Nelson
5,127,837 A 7/1992 Shah et al.
5,129,573 A 7/1992 Duffey
5,161,983 A 11/1992 Ohno
5,208,068 A 5/1993 Davis et al.
5,237,203 A 8/1993 Massaron
5,246,880 A 9/1993 Reele et al.
5,286,680 A 2/1994 Cain
5,334,029 A 8/1994 Akkapeddi et al.
5,358,621 A 10/1994 Oyama
5,378,981 A 1/1995 Higgins, III
5,419,038 A 5/1995 Wang et al.
5,454,161 A 10/1995 Beilin et al.
5,479,319 A 12/1995 Werther et al.
5,509,019 A 4/1996 Yamamura
5,527,998 A 6/1996 Anderson et al.
5,562,462 A 10/1996 Matsuba et al.
5,659,181 A 8/1997 Bridenbaugh
5,674,595 A 10/1997 Busacco et al.
5,691,041 A 11/1997 Frankeny et al.
5,716,663 A 2/1998 Capote et al.
5,741,624 A 4/1998 Jeng et al.
5,746,608 A 5/1998 Taylor
5,761,801 A 6/1998 Gebhardt et al.
5,764,485 A 6/1998 Lebaschi
5,772,451 A 6/1998 Dozier et al.
5,785,538 A 7/1998 Beaman et al.
5,787,976 A 8/1998 Hamburgen et al.
5,791,911 A 8/1998 Fasano et al.
5,802,699 A 9/1998 Fjelstad et al.
5,802,711 A 9/1998 Card et al.
5,819,579 A 10/1998 Roberts
5,904,546 A 5/1999 Wood et al.
5,913,109 A 6/1999 Distefano et al.
5,921,786 A 7/1999 Slocum et al.
5,925,931 A 7/1999 Yamamoto
5,933,558 A 8/1999 Sauvageau et al.
5,973,394 A 10/1999 Slocum et al.
6,020,597 A 2/2000 Kwak
6,062,879 A 5/2000 Beaman et al.
6,080,932 A 6/2000 Smith et al.
6,107,109 A 8/2000 Akram et al.
6,114,240 A 9/2000 Akram et al.
6,118,426 A 9/2000 Albert
6,120,588 A 9/2000 Jacobson
6,137,687 A 10/2000 Shirai et al.
6,172,879 B1 1/2001 Cilia et al.
6,177,921 B1 1/2001 Comiskey
6,178,540 B1 1/2001 Lo et al.
6,181,144 B1 1/2001 Hembree
6,200,143 B1 3/2001 Haba et al.
6,207,259 B1 3/2001 Iino et al.
6,225,692 B1 5/2001 Hinds
6,247,938 B1 6/2001 Rathburn
6,252,564 B1 6/2001 Albert
6,255,126 B1 7/2001 Mathieu et al.
6,263,566 B1 7/2001 Hembree et al.
6,270,363 B1 8/2001 Brofman et al.
6,288,451 B1 9/2001 Tsao
6,312,971 B1 11/2001 Amundson
6,313,528 B1 11/2001 Solberg
6,320,256 B1 11/2001 Ho
6,350,386 B1 2/2002 Lin
6,359,790 B1 3/2002 Meyer-Berg
6,413,790 B1 7/2002 Duthaler
6,422,687 B1 7/2002 Jacobson
6,428,328 B2 8/2002 Haba et al.
6,437,452 B2 8/2002 Lin
6,437,591 B1 8/2002 Farnworth et al.
6,459,418 B1 10/2002 Comiskey
6,461,183 B1 10/2002 Ohkita
6,462,418 B2 10/2002 Sakamoto et al.
6,462,568 B1 10/2002 Cram
6,477,286 B1 11/2002 Ouchi
6,490,786 B2 12/2002 Belke et al.
6,506,438 B2 1/2003 Duthaler et al.
6,521,489 B2 2/2003 Duthaler
6,545,291 B1 4/2003 Amundson
6,572,396 B1 6/2003 Rathburn
6,574,114 B1 * 6/2003 Brindle et al. ................ 257/698
6,593,535 B2 7/2003 Gailus
6,603,080 B2 8/2003 Jensen
6,614,104 B2 9/2003 Farnworth et al.
6,626,526 B2 9/2003 Ueki
6,639,578 B1 10/2003 Comiskey
6,642,127 B2 11/2003 Kumar et al.
6,652,075 B2 11/2003 Jacobson
6,661,084 B1 12/2003 Peterson et al.
6,662,442 B1 12/2003 Matsui et al.
6,709,967 B2 3/2004 Evers
6,744,126 B1 6/2004 Chiang
6,750,473 B2 6/2004 Amundson
6,750,551 B1 6/2004 Frutschy et al.
6,758,691 B1 7/2004 McHugh
6,773,302 B2 8/2004 Gutierrez et al.
6,800,169 B2 10/2004 Liu et al.
6,809,414 B1 10/2004 Lin et al.
6,821,131 B2 11/2004 Suzuki et al.
6,823,124 B1 11/2004 Renn
6,825,829 B1 11/2004 Albert
6,827,611 B1 12/2004 Payne et al.
6,830,460 B1 12/2004 Rathburn
6,840,777 B2 1/2005 Sathe et al.
6,853,087 B2 * 2/2005 Neuhaus et al. .............. 257/778
6,856,151 B1 2/2005 Cram
6,861,345 B2 3/2005 Ball et al.
6,910,897 B2 6/2005 Driscoll et al.
6,946,325 B2 9/2005 Yean et al.
6,962,829 B2 11/2005 Glenn et al.
6,965,168 B2 11/2005 Langhorn
6,967,640 B2 11/2005 Albert
6,971,902 B2 12/2005 Taylor
6,987,661 B1 1/2006 Huemoeller et al.
6,992,376 B2 1/2006 Jaeck
7,009,413 B1 3/2006 Alghouli
7,025,600 B2 4/2006 Higashi
7,029,289 B2 4/2006 Li
7,040,902 B2 5/2006 Li
7,045,015 B2 5/2006 Renn
7,064,412 B2 6/2006 Geissinger et al.
7,070,419 B2 7/2006 Brown et al.
7,095,090 B2 8/2006 Nakajima et al.
7,101,210 B2 9/2006 Lin
7,114,960 B2 10/2006 Rathburn
7,118,391 B2 10/2006 Minich et al.
7,121,837 B2 10/2006 Sato et al.
7,121,839 B2 10/2006 Rathburn
7,129,166 B2 10/2006 Speakman
7,138,328 B2 11/2006 Downey et al.
7,145,228 B2 12/2006 Yean et al.
7,148,128 B2 12/2006 Jacobson
7,154,175 B2 12/2006 Shrivastava et al.
7,157,799 B2 1/2007 Noquil et al.
7,180,313 B2 2/2007 Bucksch
7,217,996 B2 5/2007 Cheng et al.
7,220,287 B1 5/2007 Wyrzykowska et al.
7,229,293 B2 6/2007 Sakurai et al.
7,232,263 B2 6/2007 Sashinaka et al.
7,244,967 B2 7/2007 Hundt et al.
7,249,954 B2 7/2007 Weiss
7,276,919 B1 10/2007 Beaman et al.
7,301,105 B2 11/2007 Vasoya

(56) References Cited

U.S. PATENT DOCUMENTS 7,321,168 B2 1/2008 Tao
7,326,064 B2 2/2008 Rathburn
7,327,006 B2 2/2008 Svard et al.
7,337,537 B1 3/2008 Smetana, Jr.
7,382,363 B2 6/2008 Albert et al.
7,402,515 B2 7/2008 Arana et al.
7,410,825 B2 8/2008 Majumdar et al.
7,411,304 B2 8/2008 Kirby et al.
7,417,299 B2 8/2008 Hu
7,417,314 B1 8/2008 Lin et al.
7,422,439 B2 9/2008 Rathburn et al.
7,423,219 B2 9/2008 Kawaguchi et al.
7,427,717 B2 * 9/2008 Morimoto et al. ............ 361/748
7,432,600 B2 10/2008 Klein et al.
7,458,150 B2 12/2008 Totokawa et al.
7,459,393 B2 12/2008 Farnworth et al.
7,485,345 B2 2/2009 Renn
7,489,524 B2 2/2009 Green et al.
7,508,076 B2 3/2009 Japp et al.
7,527,502 B2 5/2009 Li
7,531,906 B2 5/2009 Lee
7,537,461 B2 5/2009 Rathburn
7,538,415 B1 5/2009 Lin et al.
7,548,430 B1 6/2009 Huemoeller et al.
7,563,645 B2 7/2009 Jaeck
7,595,454 B2 9/2009 Kresge et al.
7,619,309 B2 11/2009 Drexl et al.
7,621,761 B2 11/2009 Mok et al.
7,628,617 B2 12/2009 Brown et al.
7,632,106 B2 12/2009 Nakamura
7,645,635 B2 1/2010 Wood et al.
7,651,382 B2 1/2010 Yasumura et al.
7,658,163 B2 2/2010 Renn
7,674,671 B2 3/2010 Renn
7,726,984 B2 6/2010 Bumb et al.
7,736,152 B2 6/2010 Hougham et al.
7,748,110 B2 7/2010 Asahi et al.
7,758,351 B2 7/2010 Brown et al.
7,800,916 B2 9/2010 Blackwell et al.
7,833,832 B2 11/2010 Wood et al.
7,836,587 B2 11/2010 Kim
7,868,469 B2 1/2011 Mizoguchi
7,874,847 B2 1/2011 Matsui et al.
7,897,503 B2 3/2011 Foster et al.
7,898,087 B2 3/2011 Chainer
7,955,088 B2 6/2011 Di Stefano
7,999,369 B2 8/2011 Malhan et al.
8,044,502 B2 10/2011 Rathburn
8,058,558 B2 11/2011 Mok et al.
8,072,058 B2 12/2011 Kim et al.
8,114,687 B2 2/2012 Mizoguchi
8,120,173 B2 2/2012 Forman et al.
8,148,643 B2 4/2012 Hirose et al.
8,154,119 B2 4/2012 Yoon et al.
8,158,503 B2 4/2012 Abe
8,159,824 B2 4/2012 Cho et al.
8,178,978 B2 5/2012 McElrea et al.
8,203,207 B2 6/2012 Getz et al.
8,227,703 B2 7/2012 Maruyama et al.
8,232,632 B2 7/2012 Rathburn
8,247,702 B2 8/2012 Kouya
8,278,141 B2 10/2012 Chow et al.
8,299,494 B2 10/2012 Yilmaz et al.
8,329,581 B2 12/2012 Haba et al.
8,344,516 B2 1/2013 Chainer
8,373,428 B2 2/2013 Eldridge et al.
8,421,151 B2 4/2013 Yamashita
8,525,346 B2 9/2013 Rathburn
8,536,714 B2 9/2013 Sakaguchi
8,536,889 B2 9/2013 Nelson et al.
8,610,265 B2 12/2013 Rathburn
8,618,649 B2 12/2013 Rathburn
8,758,067 B2 6/2014 Rathburn
8,789,272 B2 7/2014 Rathburn
8,803,539 B2 8/2014 Rathburn
8,829,671 B2 9/2014 Rathburn
8,912,812 B2 12/2014 Rathburn
8,928,344 B2 1/2015 Rathburn
8,955,215 B2 2/2015 Rathburn
8,955,216 B2 2/2015 Rathburn
8,970,031 B2 3/2015 Rathburn
8,981,568 B2 3/2015 Rathburn
8,981,809 B2 3/2015 Rathburn
8,984,748 B2 3/2015 Rathburn
8,987,886 B2 3/2015 Rathburn
8,988,093 B2 3/2015 Rathburn
2001/0012707 A1 8/2001 Ho et al.
2001/0016551 A1 8/2001 Yushio et al.
2002/0011639 A1 1/2002 Carlson et al.
2002/0027441 A1 3/2002 Akram et al.
2002/0062200 A1 5/2002 Mori et al.
2002/0079912 A1 6/2002 Shahriari et al.
2002/0088116 A1 7/2002 Milkovich et al.
2002/0098740 A1 7/2002 Ooya
2002/0105080 A1 8/2002 Speakman
2002/0105087 A1 8/2002 Forbes et al.
2002/0160103 A1 10/2002 Fukunaga et al.
2003/0003779 A1 1/2003 Rathburn
2003/0096512 A1 5/2003 Cornell
2003/0114029 A1 6/2003 Lee et al.
2003/0117161 A1 6/2003 Burns
2003/0141884 A1 * 7/2003 Maruyama ......... G01R 1/06711
257/E23.067
2003/0156400 A1 8/2003 Dibene et al.
2003/0162418 A1 8/2003 Yamada
2003/0164548 A1 9/2003 Lee
2003/0188890 A1 10/2003 Bhatt et al.
2003/0189083 A1 10/2003 Olsen
2003/0231819 A1 12/2003 Palmer et al.
2004/0016995 A1 1/2004 Kuo et al.
2004/0029411 A1 2/2004 Rathburn
2004/0048523 A1 3/2004 Huang et al.
2004/0054031 A1 3/2004 Jacobson
2004/0070042 A1 4/2004 Lee et al.
2004/0077190 A1 4/2004 Huang et al.
2004/0174180 A1 9/2004 Fukushima et al.
2004/0183557 A1 9/2004 Akram
2004/0184219 A1 9/2004 Otsuka et al.
2004/0217473 A1 11/2004 Shen
2004/0243348 A1 12/2004 Minatani
2005/0020116 A1 1/2005 Kawazoe et al.
2005/0048680 A1 3/2005 Matsunami
2005/0100294 A1 5/2005 Nguyen et al.
2005/0101164 A1 5/2005 Rathburn
2005/0162176 A1 7/2005 Bucksch
2005/0164527 A1 7/2005 Radza et al.
2005/0196511 A1 9/2005 Garrity et al.
2005/0253610 A1 11/2005 Cram
2006/0001152 A1 1/2006 Hu
2006/0006534 A1 1/2006 Yean et al.
2006/0012966 A1 1/2006 Chakravorty
2006/0024924 A1 2/2006 Haji et al.
2006/0044357 A1 3/2006 Anderson
2006/0087064 A1 4/2006 Daniel et al.
2006/0125500 A1 6/2006 Watkins et al.
2006/0149491 A1 7/2006 Flach et al.
2006/0157103 A1 7/2006 Sheats et al.
2006/0160379 A1 7/2006 Rathburn
2006/0186906 A1 8/2006 Bottoms et al.
2006/0208230 A1 9/2006 Cho et al.
2006/0258912 A1 11/2006 Belson et al.
2006/0261827 A1 11/2006 Cooper et al.
2006/0281303 A1 12/2006 Trezza et al.
2007/0021002 A1 1/2007 Laurx et al.
2007/0059901 A1 3/2007 Majumdar et al.
2007/0145981 A1 6/2007 Tomita et al.
2007/0148822 A1 6/2007 Haba et al.
2007/0170595 A1 7/2007 Sinha
2007/0182431 A1 8/2007 Komatsu et al.
2007/0201209 A1 8/2007 Francis et al.
2007/0221404 A1 9/2007 Das et al.
2007/0224735 A1 9/2007 Karashima et al.
2007/0232059 A1 * 10/2007 Abe .............................. 257/774
2007/0259539 A1 11/2007 Brown et al.

(56) References Cited

U.S. PATENT DOCUMENTS

| | | | |
|---|---|---|---|
| 2007/0267138 | A1 | 11/2007 | White et al. |
| 2007/0269999 | A1 | 11/2007 | Di Stefano |
| 2007/0273394 | A1 | 11/2007 | Tanner et al. |
| 2007/0287304 | A1 | 12/2007 | Eldridge |
| 2007/0289127 | A1 | 12/2007 | Hurwitz et al. |
| 2007/0296090 | A1 | 12/2007 | Hembree |
| 2008/0008822 | A1 | 1/2008 | Kowalski |
| 2008/0020566 | A1 | 1/2008 | Egitto et al. |
| 2008/0041822 | A1 | 2/2008 | Wang |
| 2008/0057753 | A1 | 3/2008 | Rathburn et al. |
| 2008/0060838 | A1 | 3/2008 | Chen et al. |
| 2008/0073110 | A1 | 3/2008 | Shioga et al. |
| 2008/0093115 | A1 | 4/2008 | Lee |
| 2008/0115961 | A1 | 5/2008 | Mok et al. |
| 2008/0143358 | A1 | 6/2008 | Breinlinger |
| 2008/0143367 | A1 | 6/2008 | Chabineau-Lovgren |
| 2008/0156856 | A1 | 7/2008 | Barausky et al. |
| 2008/0157361 | A1 | 7/2008 | Wood et al. |
| 2008/0182436 | A1 | 7/2008 | Rathburn |
| 2008/0185180 | A1 | 8/2008 | Cheng et al. |
| 2008/0197867 | A1 | 8/2008 | Wokhlu et al. |
| 2008/0220584 | A1 | 9/2008 | Kim et al. |
| 2008/0241997 | A1 | 10/2008 | Sunohara et al. |
| 2008/0246136 | A1 | 10/2008 | Haba et al. |
| 2008/0248596 | A1 | 10/2008 | Das et al. |
| 2008/0250363 | A1 | 10/2008 | Goto et al. |
| 2008/0265919 | A1 | 10/2008 | Izadian |
| 2008/0290885 | A1 | 11/2008 | Matsunami |
| 2008/0309349 | A1 | 12/2008 | Sutono |
| 2009/0058444 | A1 | 3/2009 | McIntyre |
| 2009/0061089 | A1 | 3/2009 | King |
| 2009/0065918 | A1 | 3/2009 | Murphy |
| 2009/0127698 | A1 | 5/2009 | Rathburn |
| 2009/0133906 | A1 | 5/2009 | Baek |
| 2009/0158581 | A1 | 6/2009 | Nguyen et al. |
| 2009/0180236 | A1 | 7/2009 | Lee et al. |
| 2009/0224404 | A1 | 9/2009 | Wood et al. |
| 2009/0241332 | A1 | 10/2009 | Lauffer et al. |
| 2009/0267628 | A1 | 10/2009 | Takase |
| 2009/0321915 | A1 | 12/2009 | Hu et al. |
| 2010/0022105 | A1 | 1/2010 | Di Stefano |
| 2010/0133680 | A1 | 6/2010 | Kang et al. |
| 2010/0143194 | A1 | 6/2010 | Lee et al. |
| 2010/0213960 | A1 | 8/2010 | Mok et al. |
| 2010/0300734 | A1 | 12/2010 | Ables et al. |
| 2011/0083881 | A1 | 4/2011 | Nguyen et al. |
| 2011/0101540 | A1 | 5/2011 | Chainer |
| 2012/0017437 | A1 | 1/2012 | Das et al. |
| 2012/0043119 | A1 | 2/2012 | Rathburn |
| 2012/0043667 | A1 | 2/2012 | Rathburn |
| 2012/0044659 | A1 | 2/2012 | Rathburn |
| 2012/0049342 | A1 | 3/2012 | Rathburn |
| 2012/0049877 | A1 | 3/2012 | Rathburn |
| 2012/0051016 | A1 | 3/2012 | Rathburn |
| 2012/0055701 | A1 | 3/2012 | Rathburn |
| 2012/0055702 | A1 | 3/2012 | Rathburn |
| 2012/0056332 | A1 | 3/2012 | Rathburn |
| 2012/0056640 | A1 | 3/2012 | Rathburn |
| 2012/0058653 | A1 | 3/2012 | Rathburn |
| 2012/0061846 | A1 | 3/2012 | Rathburn |
| 2012/0061851 | A1 | 3/2012 | Rathburn |
| 2012/0062270 | A1 | 3/2012 | Rathburn |
| 2012/0068727 | A1 | 3/2012 | Rathburn |
| 2012/0161317 | A1 | 6/2012 | Rathburn |
| 2012/0164888 | A1 | 6/2012 | Rathburn |
| 2012/0168948 | A1 | 7/2012 | Rathburn |
| 2012/0171907 | A1 | 7/2012 | Rathburn |
| 2012/0182035 | A1 | 7/2012 | Rathburn |
| 2012/0199985 | A1 | 8/2012 | Rathburn |
| 2012/0202364 | A1 | 8/2012 | Rathburn |
| 2012/0244728 | A1 | 9/2012 | Rathburn |
| 2012/0252164 | A1 | 10/2012 | Nakao et al. |
| 2012/0257343 | A1 | 10/2012 | Das et al. |
| 2012/0268155 | A1 | 10/2012 | Rathburn |
| 2013/0078860 | A1 | 3/2013 | Rathburn |
| 2013/0105984 | A1 | 5/2013 | Rathburn |
| 2013/0203273 | A1 | 8/2013 | Rathburn |
| 2013/0206468 | A1 | 8/2013 | Rathburn |
| 2013/0210276 | A1 | 8/2013 | Rathburn |
| 2013/0223034 | A1 | 8/2013 | Rathburn |
| 2013/0244490 | A1 | 9/2013 | Rathburn |
| 2013/0330942 | A1 | 12/2013 | Rathburn |
| 2014/0043782 | A1 | 2/2014 | Rathburn |
| 2014/0080258 | A1 | 3/2014 | Rathburn |
| 2014/0192498 | A1 | 7/2014 | Rathburn |
| 2014/0220797 | A1 | 8/2014 | Rathburn |
| 2014/0225255 | A1 | 8/2014 | Rathburn |
| 2014/0242816 | A1 | 8/2014 | Rathburn |
| 2015/0013901 | A1 | 1/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |
| WO | WO 2015/006393 | 1/2015 |

OTHER PUBLICATIONS

Definition of “free-flowing” from http://dictionary.cambridge.org, Jan. 26, 2015.*

Office Action mailed Oct. 30, 2013 in co-pending U.S. Appl. No. 13/266,486, now published as US Patent Application Publication No. US 2012/0055701.

Amendment and Response filed Nov. 6, 2013 in co-pending U.S. Appl. No. 13/266,486, now published as US Patent Application Publication No. US 2012/0055701.

Notice of Non-Compliant Amended mailed Nov. 15, 2013 in co-pending U.S. Appl. No. 13/266,486, now published as US Patent Application Publication No. US 2012/0055701.

Response and Examiner’s Interview Summary filed Nov. 20, 2013 in co-pending U.S. Appl. No. 13/266,486, now published as US Patent Application Publication No. US 2012/0055701.

Response to Restriction Requirement filed Oct. 7, 2013 in co-pending U.S. Appl. No. 13/266,573, now published as US Patent Application Publication No. 2012/0061846.

Office Action mailed Nov. 22, 2013 in co-pending U.S. Appl. No. 13/266,907, now published as US Patent Application Publication No. US 2012/0268155.

Restriction Requirement mailed Dec. 9, 2013 in co-pending U.S. Appl. No. 13/318,171, now published as US Patent Application Publication No. US 2012/0049877.

(56) References Cited

OTHER PUBLICATIONS

Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.

(56) References Cited

OTHER PUBLICATIONS

Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701
Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.

(56) References Cited

OTHER PUBLICATIONS

Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Tester Interface, filed Nov. 7, 2011.
Co-pending U.S. Appl. No. 13/319,228, titled Singulated Semiconductor Device Separable Electrical Interconnect, filed Nov. 7, 2011.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.

(56) References Cited

OTHER PUBLICATIONS

Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Co-pending U.S. Appl. No. 13/575,368, titled High Speed Backplane Connector, filed Jul. 26, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-to-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Office Action mailed NOv. 17, 2014 in co-pending U.S. Appl. No. 13/879,883, now published as US Patent Application No. 2013/0244490.
Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.

(56) References Cited

OTHER PUBLICATIONS

Co-pending U.S. Appl. No. 14/565,724 titled Performance Enhanced Semiconductor Socket, filed Dec. 10, 2014.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.

(56) References Cited

OTHER PUBLICATIONS

Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Final Office Action mailed Mar. 16, 2015 in co-pending U.S. Appl. No. 13/320,285, now published as US Patent Application Publication No. US 2012/0055702.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.

* cited by examiner

RESILIENT CONDUCTIVE ELECTRICAL INTERCONNECT

CROSS-REFERENCE TO RELATED APPLICATIONS

This application is a national stage application under 35 U.S.C. §371 of International Application No. PCT/US2010/036313, titled RESILIENT CONDUCTIVE ELECTRICAL INTERCONNECT, filed May 27, 2010, which claims priority to U.S. Provisional Application No. 61/183,335, filed Jun. 2, 2009, both of which are hereby incorporated by reference in their entireties.

TECHNICAL FIELD

The present application relates to a high performance electrical interconnect between circuit members, such as integrated circuits, printed circuit assemblies (PCA), and the like. The present interconnect can also be formed directly on a circuit member.

BACKGROUND OF THE INVENTION

Traditional IC sockets are generally constructed of an injection molded plastic insulator housing which has stamped and formed copper alloy contact members stitched or inserted into designated positions within the housing. These contact members can be in a flat or "blank" format, or they can be produced with a series of forms, bends, and features to accommodate a desired function such as retention within the plastic housing.

The designated positions in the insulator housing are typically shaped to accept and retain the contact members. The assembled socket body is then generally processed through a reflow oven which melts and attaches solder balls to the base of the contact member. During final assembly onto a printed circuit board ("PCB"), the desired interconnect positions on the circuit board are printed with solder paste or flux and the socket assembly is placed such that the solder balls on the socket contacts land onto the target pads on the PCB. The assembly is then reheated to reflow the solder balls on the socket assembly. When the solder cools it essentially welds the socket contacts to the PCB, creating the electrical path for signal and power interaction with the system.

During use, this assembled socket receives one or more packaged integrated circuits and connects each terminal on the package to the corresponding terminal on the PCB. The terminals on the package are held against the contact members by applying a load to the package, which is expected to maintain intimate contact and reliable circuit connection throughout the life of the system. No permanent connection is required. Consequently, the packaged integrated circuit can be removed or replaced without the need for reflowing solder connections.

As processors and electrical systems evolve, several factors have impacted the design of traditional sockets. Increased terminal count, reductions in the terminal pitch (i.e., the distance between the contacts), and signal integrity have been main drivers that impact socket and contact design. As terminal count increases, the IC packages get larger due to the additional space needed for the terminals. As the IC packages grow larger the relative flatness of the IC package and corresponding PCB becomes more important. A certain degree of compliance is required between the contacts and the terminal pads to accommodate the topography differences and maintain reliable connections.

IC package manufacturers tend to drive the terminal pitch smaller so they can reduce the size of the IC package and reduce the flatness effects. As the terminal pitch reduces, however, the surface area available to place a contact is also reduced, which limits the space available to locate resilient contact members that can deflect without shorting to an adjacent contact member.

For mechanical reasons, longer contact members are preferred because they have desirable spring properties. Long contact members, however, tend to reduce the electrical performance of the connection by creating a parasitic effect that impacts the signal as it travels through the contact. Long contact members also require thinner walls in the housing in order to meet pitch requirements, increasing the risk of housing warpage and cross-talk between adjacent contact members. The demands of pitch reduction often reduce the available area for spring features. Often such contact members require retention features that add electrical parasitic effects.

The contact members are typically made from a selection of Copper based alloys. Since copper oxidizes, the contacts are typically plated with nickel to prevent migration, and a final coating of either a precious metal like gold or a solderable metal such as tin. In very cost sensitive applications, the contacts are sometimes selectively plated at the interface points where they will connect to save the cost of the plating.

The copper based alloys also represent a compromise of material properties. For example, the spring constant of copper alloys is less than stainless steel, and the conductivity of copper alloys is less than pure copper or silver. Copper also oxidizes readily, so plating must be applied to at least a portion of the contact to improve the corrosion resistance.

One alternative to traditional resilient contact members are composite contacts containing tiny particles of silver molded into a silicone matrix. When compressed, the silver particles touch each other can create electrical contact. These composite contact members suffer from high contact resistance due to the silicone material interfering with the conductive path.

Next generation systems will operate above 5 GHz and beyond. Traditional sockets and interconnects will reach mechanical and electrical limitations that mandate alternate approaches.

BRIEF SUMMARY OF THE INVENTION

The present disclosure is directed to an interconnect assembly that will enable next generation electrical performance. The present interconnect assembly can be located between circuit members or can be formed directly on a circuit member.

The present disclosure merges the long-term reliability provided by polymer-based compliance, with the electrical performance of metal conductors. Contact resistance is reduced by grouping the conductive particles in a reservoir substantially absent of silicone or binder material, to create a superior electrical connection.

One embodiment is directed to an interconnect assembly including a resilient material with a plurality of through holes extending from a first surface to a second surface. A plurality of discrete, free-flowing conductive particles is located in the through holes. The conductive particles are preferably substantially free of non-conductive materials. A plurality of first contact tips are located in the through holes adjacent the first surface and a plurality of second contact tips are located in the through holes adjacent the second surface. The resilient material provides the required resilience, while the conductive particles provide a conductive path substantially free of non-conductive materials.

One or more of the contact tips optionally include a protrusion engaged with the conductive particles. In one embodiment, the though holes are printed with non-moldable features. The through holes can have a uniform or a non-uniform cross-sectional shape, along axis extending between the contact tips. The contact tips are adapted to move in at least the pitch and roll directions relative to the interconnect assembly. A plurality of electrical devices are optionally printed onto the interconnect assembly and electrically coupled to at least one of the contact tips.

The present disclosure is also directed to an electrical assembly with a first circuit member having contact pads compressively engaged with distal ends of a plurality of first contact tips and a second circuit member with contact pads compressively engaged with distal ends of a plurality of the second contact tips. The first and second circuit members can be a dielectric layer, a printed circuit board, a flexible circuit, a bare die device, an integrated circuit device, organic or inorganic substrates, or a rigid circuit.

One or more circuitry planes are optionally printed on the interconnect assembly. The circuit geometry preferably has conductive traces that have substantially rectangular cross-sectional shapes, corresponding to recesses printed in various layers. The use of additive printing processes permit conductive material, non-conductive material, and semi-conductive material to be located on a single layer.

In one embodiment, pre-formed conductive trace materials are located in the recesses formed in the dielectric layers. The recesses are than plated to form conductive traces with substantially rectangular cross-sectional shapes. In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shapes.

The present disclosure is also directed to an interconnect assembly for an integrated circuit device with a plurality of contact pads. The interconnect assembly includes a resilient material printed on the integrated circuit device with at least one through hole generally aligned with each contact pad. A plurality of discrete, free-flowing conductive particles is deposited in the through holes. The conductive particles are substantially free of non-conductive materials. At least one contact tip is located in each through hole and secured to a distal surface of the resilient material.

The present disclosure is also directed to a method of forming an interconnect assembly. A plurality of first contact tips is located on a carrier. A resilient material is printed on the carrier with a plurality of through holes generally aligned with the first contact tips. A plurality of discrete, free-flowing conductive particles is deposited in the through holes, preferably by printing. The conductive particles are substantially free of non-conductive materials. A plurality of second contact tips are located in the through holes adjacent a second surface. The carrier is then separated from the first contact tips and the resilient material.

The resilient material can be printed with one or more non-moldable features. The contact tips and/or a plurality of electrical devices are optionally printed on the resilient material. In use, contact pads on a first circuit member are compressively engaged with distal ends of a plurality of first contact tips, and contact pads on a second circuit member are compressively engaged with distal ends of a plurality of second contact tips.

The present disclosure is also directed to a method for forming an interconnect assembly for an integrated circuit device with a plurality of contact pads. A resilient material is printed on the integrated circuit device with at least one through hole generally aligned with each contact pad. A plurality of discrete, free-flowing conductive particles is deposited in the through holes. The conductive particles are substantially free of non-conductive materials. At least one contact tip is located in each through hole. The contact tips are secured to a distal surface of the resilient material.

The present disclosure is also directed to several additive processes that combine the mechanical or structural properties of a polymer material, while adding metal materials in an unconventional fashion, to create electrical paths that are refined to provide electrical performance improvements. By adding or arranging metallic particles, conductive inks, plating, or portions of traditional alloys, the composite contact structure reduces parasitic electrical effects and impedance mismatch, potentially increasing the current carrying capacity.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The present interconnect assembly can serve as a platform to add passive and active circuit features to improve electrical performance or internal function and intelligence. Passive circuit features refer to a structure having a desired electrical, magnetic, or other property, including but not limited to a conductor, resistor, capacitor, inductor, insulator, dielectric, suppressor, filter, varistor, ferromagnet, and the like.

For example, electrical features and devices are printed onto the interconnect assembly using, for example, inkjet printing, aerosol printing, or other printing technologies. The ability to enhance the interconnect assembly, such that it mimics aspects of the IC package and a PCB, allows for reductions in complexity for the IC package and the PCB while improving the overall performance of the interconnect assembly.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

The interconnect assembly can be configured with conductive traces that reduce or redistribute the terminal pitch, without the addition of an interposer or daughter substrate. Grounding schemes, shielding, electrical devices, and power planes can be added to the interconnect assembly, reducing the number of connections to the PCB and relieving routing constraints while increasing performance.

DETAILED DESCRIPTION OF THE INVENTION

An interconnect assembly, according to the present disclosure, may permit fine contact-to-contact spacing (pitch) on the order of less than 1.0 pitch, and more preferably a pitch of less than about 0.7 millimeter, and most preferably a pitch of less than about 0.4 millimeter. Such fine pitch interconnect assemblies are especially useful for communications, wireless, and memory devices. The disclosed low cost, high signal performance interconnect assemblies, which have low profiles and can be soldered to the system PC board, are particularly useful for desktop and mobile PC applications.

The disclosed interconnect assemblies permit IC devices to be installed and uninstalled without the need to reflow solder. The solder-free electrical connection of the IC devices is environmentally friendly. In another embodiment, the interconnect assembly can be formed directly on one of the circuit members.

Figure 1:
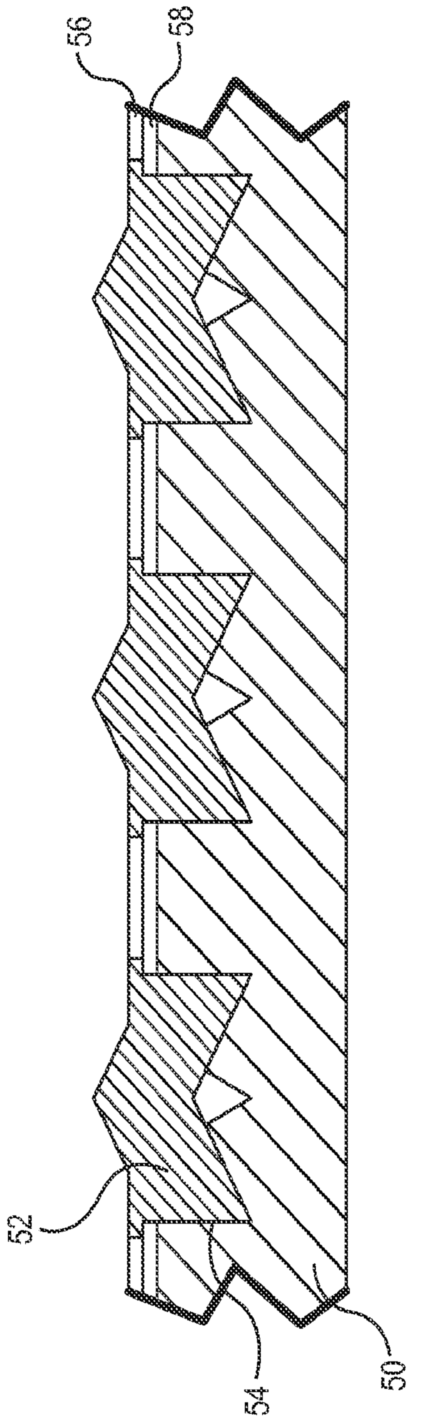
FIG. 1 is a cross-sectional view of a carrier used to form an interconnect assembly in accordance with an embodiment of the present disclosure.

FIG. 1 is a side cross-sectional view of a portion of a carrier 50 with an array of contact tips 52 in accordance with an embodiment of the present disclosure. In one embodiment, the carrier 50 can include an array of preformed recesses 54 into which the contact tips 52 are form, such as by deposition of a metallic composition followed by sintering. In another embodiment, preformed contact tips 52 are positioned in the recesses 54. Preformed contact tips 52 can be deposited into the recesses 54 using a variety of techniques, such as for example stitching or vibratory techniques. In one embodiment, the contact tips 52 are press-fit into the recesses 54. The contact tips 52 can be bent, peened, coined or otherwise plastically deformed during or after insertion into the recesses 54. One or more covering layers 56, 58 are optionally printed onto the carrier 50 to retain the contact tips 52 to the resulting interconnect assembly 88 (e.g., see FIG. 4).

The carrier 50 may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

Figure 2:
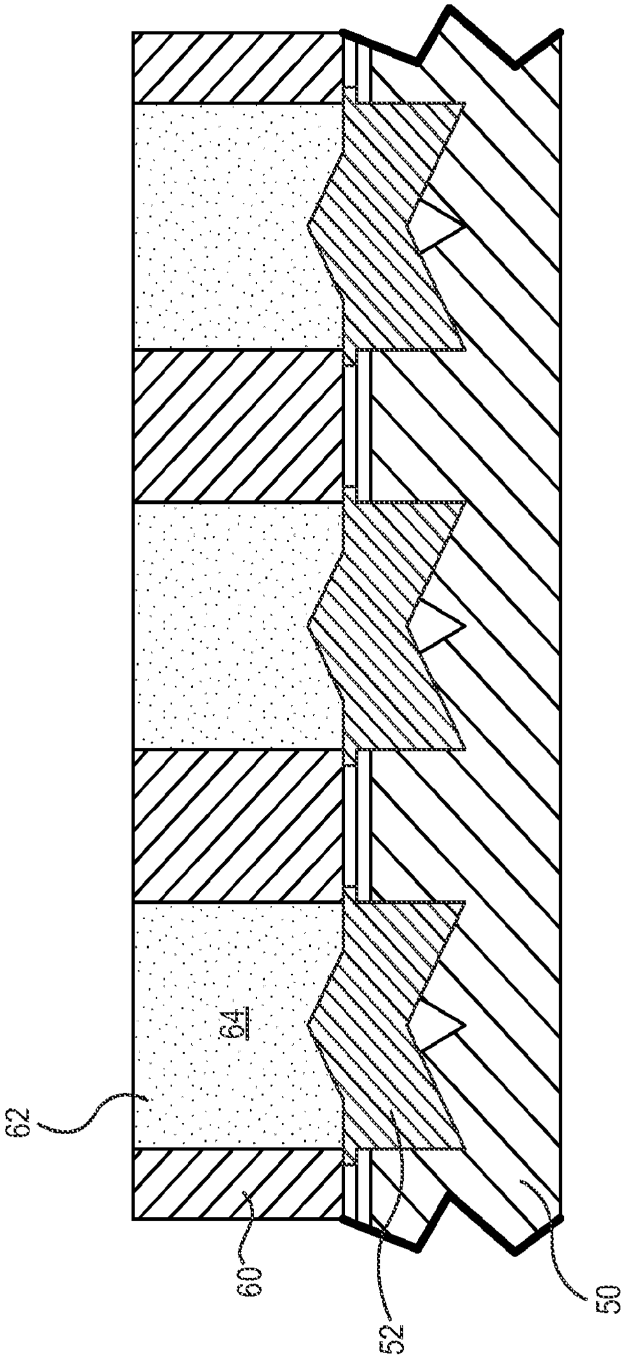
FIG. 2 illustrates a resilient material printed on the carrier of FIG. 1.

FIG. 2 illustrates resilient material 60 printed or deposited on the carrier 50 to create through holes 62 aligned with contact tips 52. Highly conductive particles 64 are screened or printed into the through holes 62. The individual conductive particles 64 may be solid or hollow, and may be made from one or more conductive materials. The preferred conductive particles 64 are silver and gold. The conductive particles 64 preferably do not include any non-conductive materials, such as an elastomeric binder. Rather, the conductive particles 64 are discrete, free-flowing elements. As used herein, "conductive particles" refers to a plurality of free-flowing conductive elements, substantially free of binders or other non-conductive materials.

The resilient material 60 is selected to elastically deform under pressure, but to substantially resume its original shape when the force is removed. The force required to deform the resilient material 60 is preferably greater than the force required to displace conductive particles 64. Consequently, when deformed, the resilient material 60 can store sufficient energy to displace the conductive particles 64.

Figure 3:
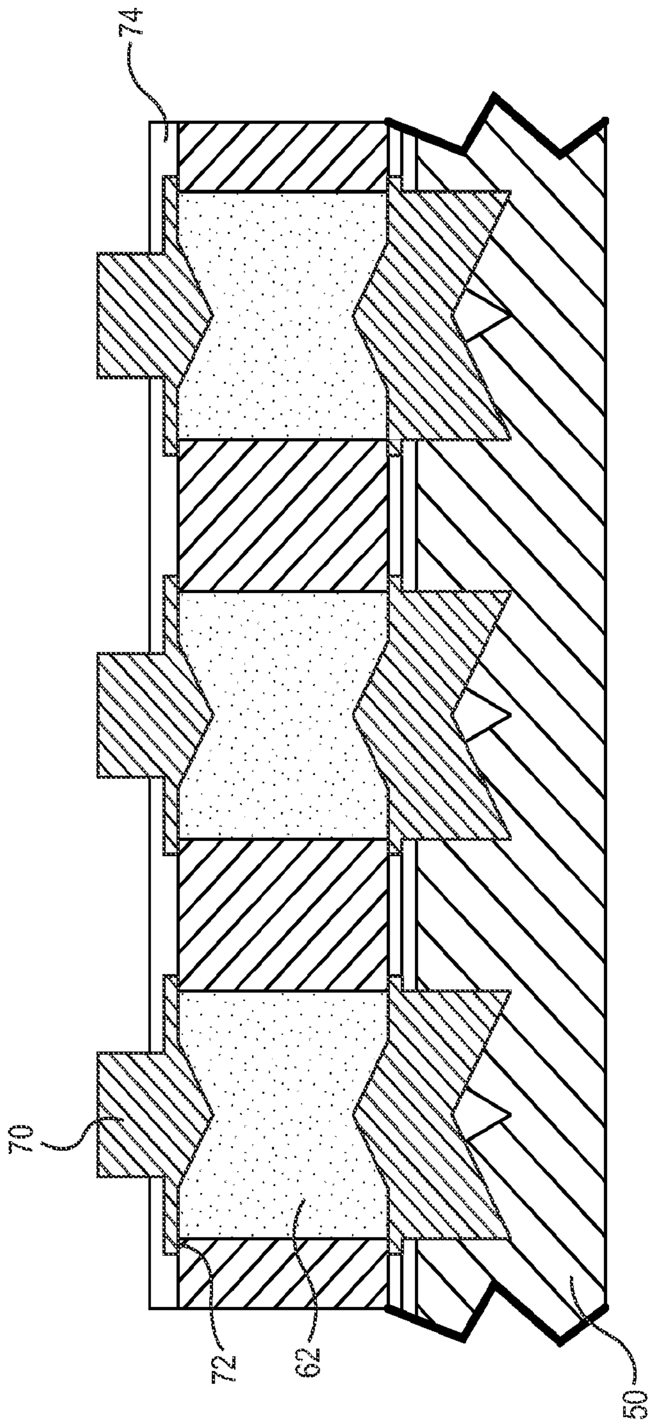
FIG. 3 is a cross sectional view of an interconnect assembly in accordance with another embodiment of the present disclosure.

As illustrated in FIG. 3, opposing contact tips 70 are located at tops 72 of the through holes 62. The contact tips 70 can be discrete, preformed elements deposited into place, or printed onto the complaint material 60. Covering layer 74 is optionally printed around the contact tips 70 to provide mechanical and electrical stability.

Figure 4:
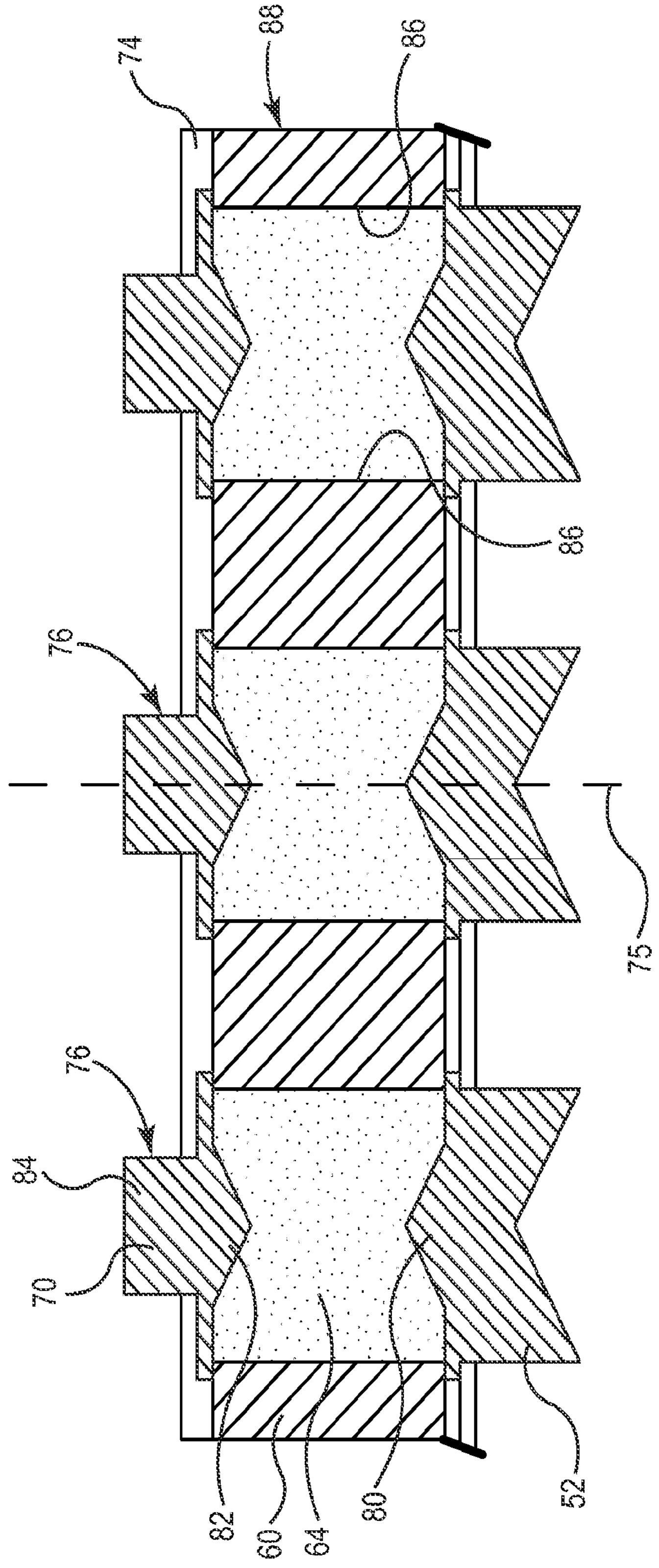
FIG. 4 is a cross sectional view of an interconnect assembly of FIG. 3 with the carrier removed.

As illustrated in FIG. 4, the carrier layer 50 is then removed to reveal interconnect assembly 88. The contact tips 52, the conductive particles 64 and the contact tips 70 combine to form resilient contact members 76. The resilient contact members 76 effectively decouple the elastomeric properties of the resilient material 60 from the electrical properties of the conductive particles 64.

The contact tips 52, 70 are preferably constructed of copper or similar metallic materials such as phosphor bronze or beryllium-copper. The contact tips 52, 70 are preferably plated with a corrosion resistant metallic material such as nickel, gold, silver, palladium, or multiple layers thereof. In some embodiments the contact tips 70 are encapsulated by covering layer 74, except the distal ends 84. Examples of suitable encapsulating materials include Sylgard available from Dow Corning Silicone of Midland, Mich. and Master Sil 713 available from Master Bond Silicone of Hackensack, N.J.

In the illustrated embodiment, contact tips 52 include protrusions 80 that promote electrical coupling with the conductive particles 64. The contact tip 70 optionally includes a similar protrusion 82. The protrusions 80, 82 are preferably conical to facilitate displacement of the conductive particles 64 toward the resilient side walls 86 of the resilient material 60 during compression of the interconnect assembly 88.

The through holes 62 preferably have a generally uniform cross section extending along axis 75 between the contact tips 52, 70. The cross-sectional shape can be rectangular, square, circular, triangular, or a variety of other shapes. A square or rectangular cross-section maximizes the volume of the through holes 62, and hence the quantity of conductive particles 62. A circular cross-section provides the most uniform deformation when the contact tips 52, 70 are subject to a compressive force.

Figure 5:
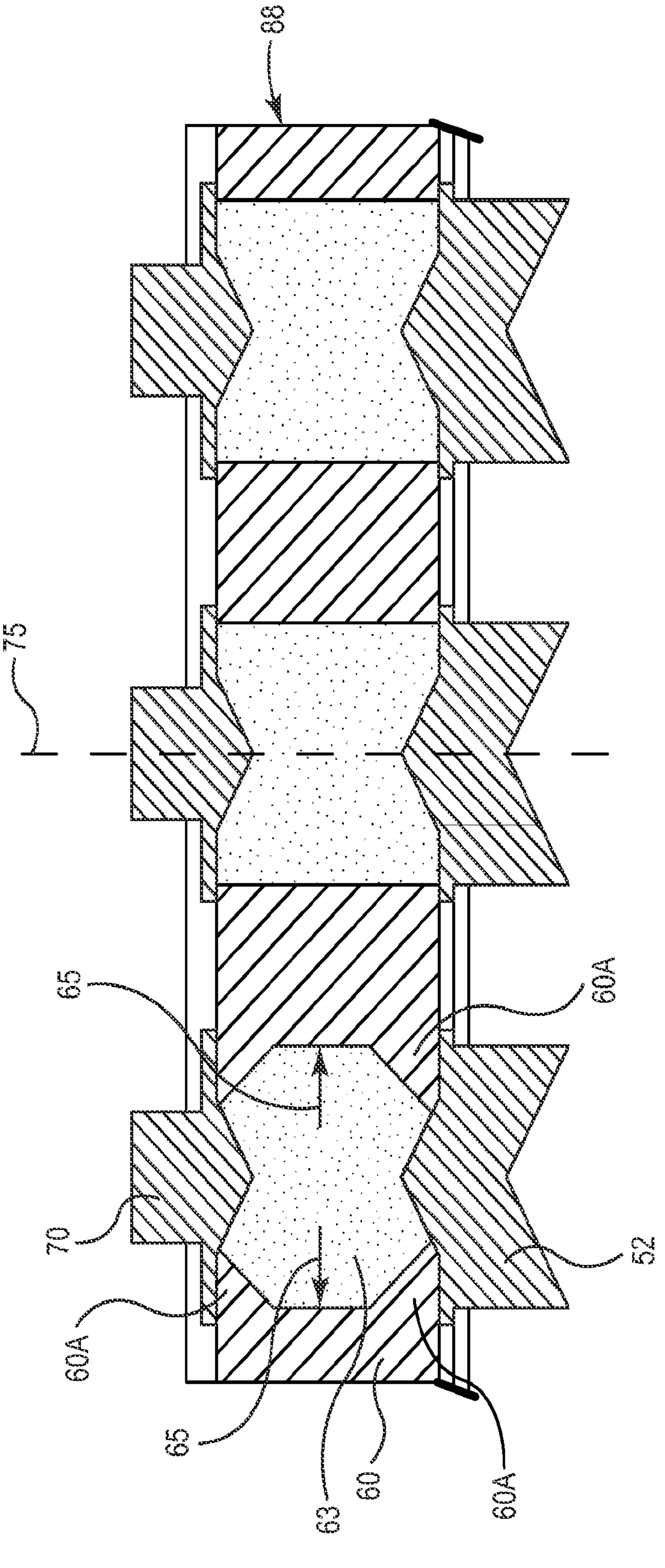
FIG. 5 is a cross-sectional view of an alternate interconnect assembly in accordance with another embodiment of the present disclosure.

FIG. 5 illustrates an alternate interconnect assembly 88 in which one or more of the through holes 62 includes a non-uniform cross-sectional shape 63 along the axis 75. The non-uniform cross-sectional shape 63 promotes preferential deformation of the resilient material 60 in directions 65.

Figure 6:
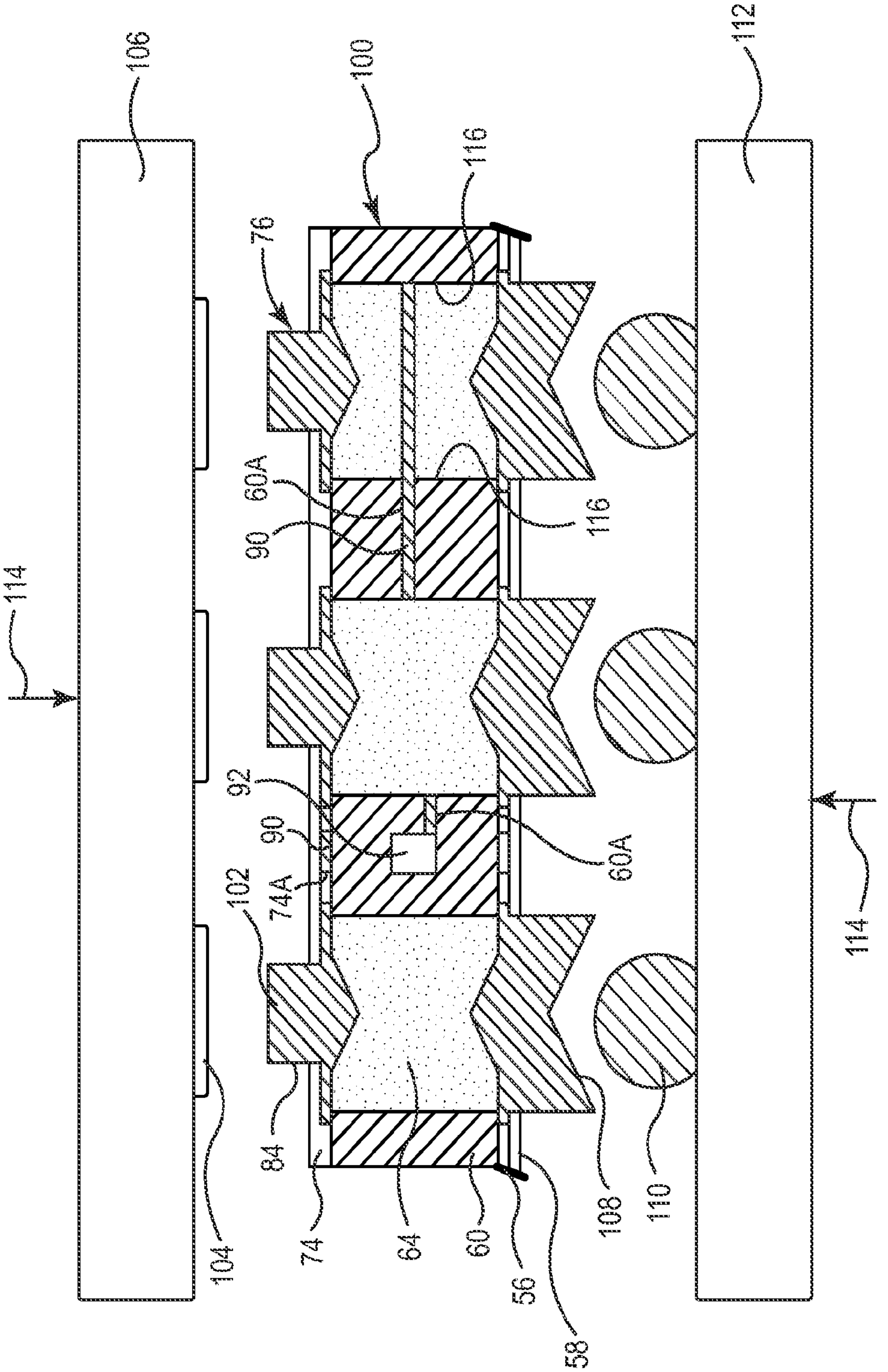
FIG. 6 is a cross-sectional view of an interconnect assembly with electrical devices in accordance with another embodiment of the present disclosure.

The resilient material 60 located adjacent to the contact members 52, 70 facilitates displacement of the contact members 52, 70 in the pitch and roll directions relative electrical contacts on first and second circuit members (see e.g., FIG. 6). In some embodiments, the non-uniform cross-sectional shape 63 is a non-moldable shape. Applying the resilient material 60 using printing technology permits the through holes 62 to have a variety of internal features, undercuts, or cavities that are difficult or typically not possible to make using conventional molding or machining techniques, referred to herein as a "non-moldable feature."

FIG. 6 illustrates an alternate interconnect assembly 100 in which additional circuitry or electrical devices are added to one or more of the layer 56, 58, 60, 74. For example, one or more of the layers 56, 58, 60, 74 can be designed to provide electrostatic dissipation or to reduce cross-talk between the contact members 76. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

The additional circuitry 90 or electrical devices 92 are can also be printed during construction of the layers 56, 58, 60, 74 of the interconnect assembly 100. For example, recesses 60A, 74A can be printed in layers 60 and 70, respectively, to permit control of the location, cross section, material content, and aspect ratio of electric traces 90. The layer 60 may need to be printed as a series of sub-layers to permit the recesses 60A and subsequent traces 90 to be printed.

The conductive traces 90 can be formed by depositing a conductive material in a first state in the recesses 60A, 74A, and then processed to create a second more permanent state. For example, the metallic powder is printed according to the circuit geometry and subsequently sintered, or the curable conductive material flows into the circuit geometry and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source. The conductive traces 90 are then printed in the recesses 60A, 74A using any of the techniques disclosed herein.

Maintaining the conductive traces 90 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 60A, 74A to control the aspect ratio of the conductive traces 90 results in a more rectangular or square cross-section of the conductive traces 90, with the corresponding improvement in signal integrity.

In another embodiment, pre-patterned or pre-etched thin conductive foil circuit traces are transferred to the recesses 60A, 74A. For example, a pressure sensitive adhesive can be used to retain the copper foil circuit traces in the recesses 60A, 74A. The trapezoidal cross-sections of the pre-formed conductive foil traces are then post-plated. The plating material fills the open spaces in the recesses 60A, 74A not occupied by the foil circuit geometry, resulting in a substantially rectangular or square cross-sectional shape corresponding to the shape of the recesses 60A, 74A.

In another embodiment, a thin conductive foil is pressed into the recesses 60A, 74A, and the edges of the recesses 60A, 74A acts to cut or shear the conductive foil. The process locates a portion of the conductive foil in the recesses 60A, 74A, but leaves the negative pattern of the conductive foil not wanted outside and above the recesses 60A, 74A for easy removal. Again, the foil in the recesses 60A, 74A is preferably post plated to add material to increase the thickness of the conductive traces 90 and to fill any voids left between the conductive foil and the recesses 60A, 74A.

The devices 90 92 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 90, 92 can be formed using printing technology, adding intelligence to the interconnect assembly 100. Features that are typically located on the first or second circuit members 106, 112 can be incorporated into the interconnect assembly 100 in accordance with an embodiment of the present disclosure.

The availability of printable silicon inks provides the ability to print electrical devices 90, 92, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The conductive traces and electrical devices can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing process are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer, such as layer 74, can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Turning back to FIG. 6, contact tips 84 include flat distal surface 102 adapted to couple with contact pads 104 on the first circuit member 106. Contact tips 52 include distal recesses 108 configured to electrically couple with solder balls 110 on the second circuit member 112. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

When the first and second circuit members 106, 112 are compressively engaged with the interconnect assembly 100, compressive forces 114 act to displace the conductive particles 64 toward the resilient sidewalls 116 of the through holes 62. The resilient sidewalls 116 deform in response to the displacement of the conductive particles 64. When the compressive forces 114 are removed, the resilient material 60 returns to substantially its original shape. The resilient material 60 prefer has a hardness or Durometer greater than the conductive particles 64. Consequently, when the compressive force 114 is removed, the resilient material 60 has sufficient stored energy to displace the conductive particles 64.

The resilience of the material 60 and the flow of conductive particles 64 within the through holes 62 permit the contact tips 52,70 to respond to non-planarity of the circuit members 106, 112. In particular, the contact tips 52, 70 can move in at least pitch and roll, as well as displacement in the Z-direction 120.

Figure 7:
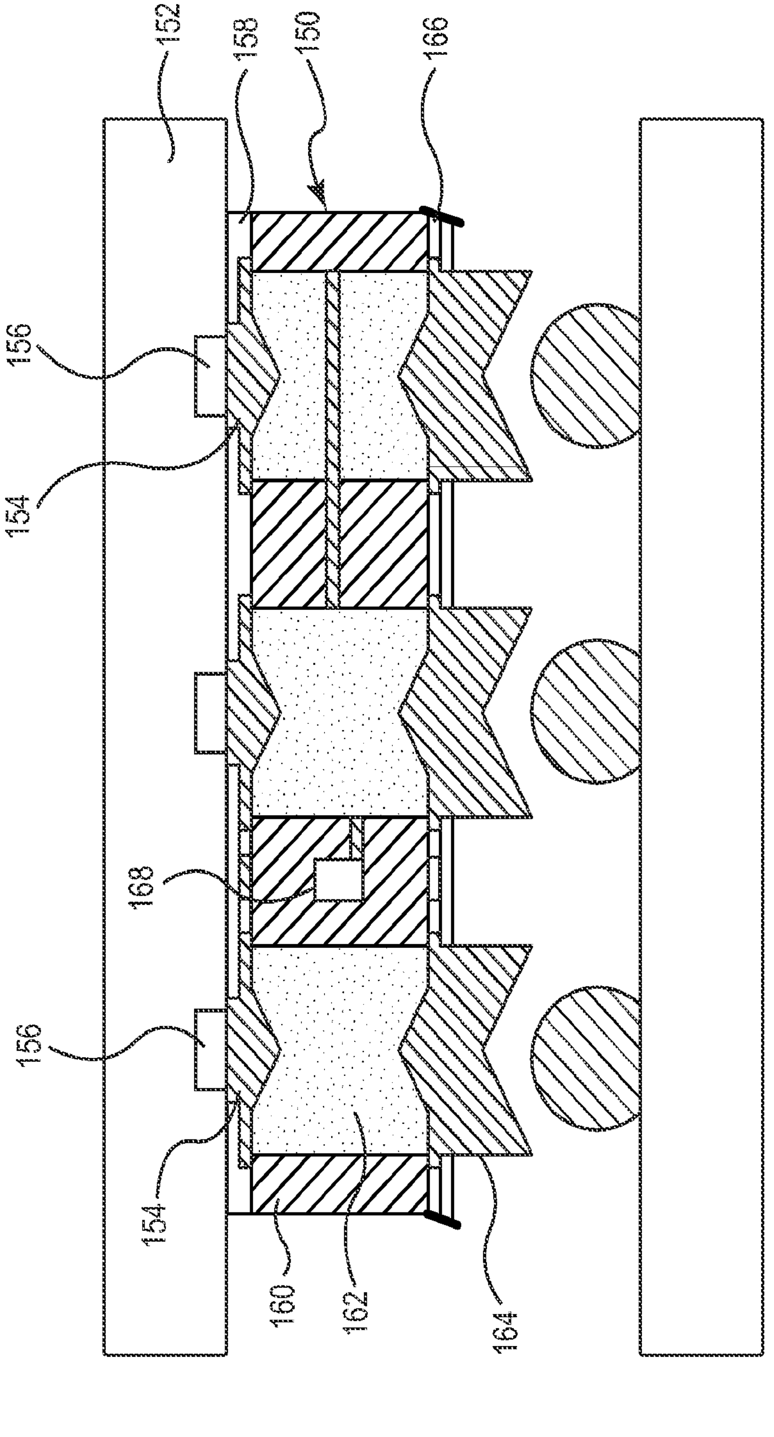
FIG. 7 is a cross-sectional view of an interconnect assembly formed directly on a circuit members in accordance with another embodiment of the present disclosure.

FIG. 7 illustrate an alternate interconnect assembly 150 formed directly onto circuit member 152. Contact tips 154 are electrically coupled to contact pads 156 on the circuit member 152. Carrier layer 158 is preferably provided to position and secure the contact tips 154 for subsequent processing. The resilient layer 160 is then printed over the carrier layer 158 and the contact tips 154, followed by deposition of the conductive particles 162 and the second set of contact tips 164. Covering layers 166 are then printed on the interconnect assembly 150 to retain the second contact tips 164 in place. Electrical devices 168 are optionally printed as part of the interconnect assembly 150, as discussed above.

Figure 8:
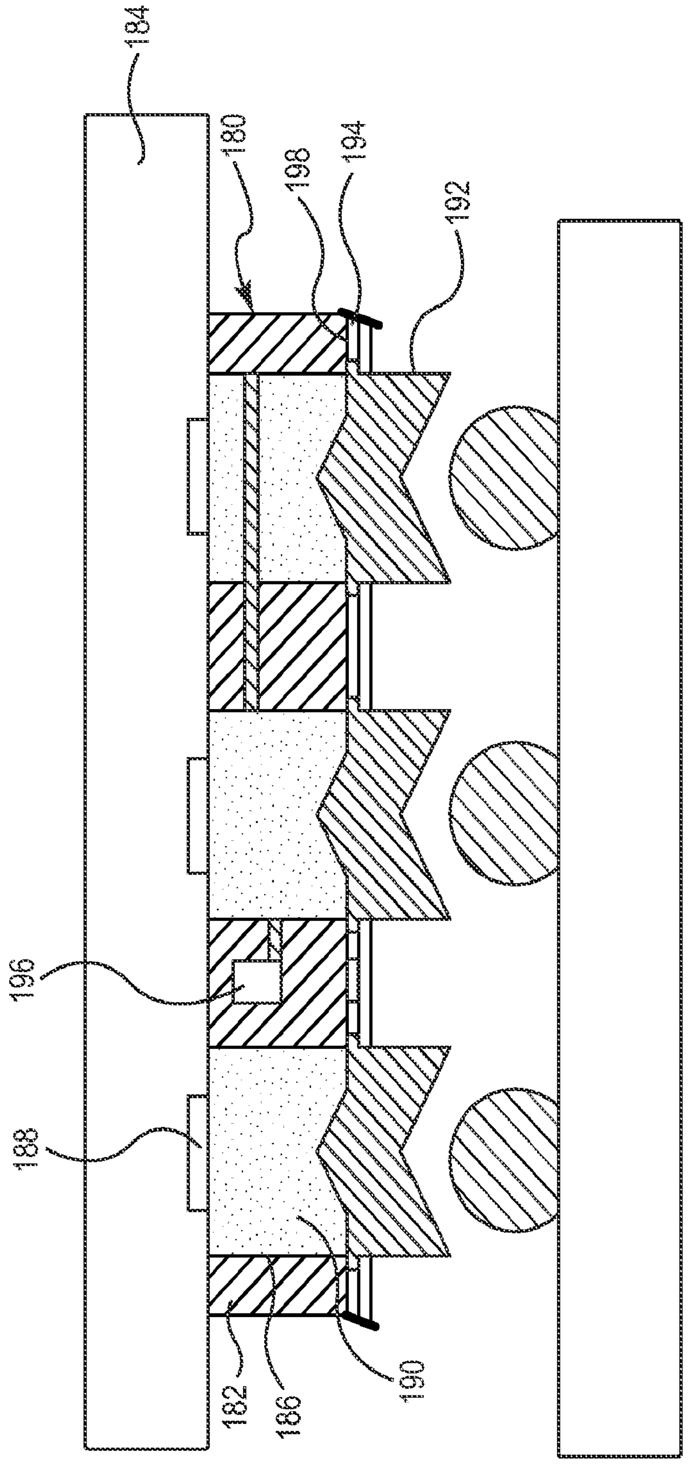
FIG. 8 is a cross-sectional view of an alternate interconnect assembly formed directly on a circuit member in accordance with another embodiment of the present disclosure.

FIG. 8 illustrate an alternate interconnect assembly 180 that omits the first set of contact tips. In particular, the resilient material 182 is printed directly on the circuit member 184 so through holes 186 are generally aligned with contact pads 188. Conductive particles 190 are then deposited in the through holes 186. Second contact tips 192 are secured to distal surface 198 of the resilient material 182 by one or more covering layers 194. Electrical devices 196 are optionally printed as part of the interconnect assembly 180, as discussed above.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. An interconnect assembly comprising: a resilient material printed to include a plurality of through holes extending from a first surface to a second surface and a plurality of recesses located along at least one of the first and second surfaces corresponding to desired circuit traces; a plurality of discrete, free-flowing conductive particles located in the through holes, the conductive particles being free of binders or non-conductive materials; a plurality of first contact tips located in the through holes adjacent the first surface; a plurality of second contact tips located in the through holes adjacent the second surface; and a conductive material printed in at least a portion of the recesses comprising conductive traces electrically coupled to one or more of the contact tips, wherein the contact tips are solid and non-spherical and move in at least the pitch and roll directions relative to the interconnect assembly.

2. The interconnect assembly of claim 1 wherein one or more of the contact tips comprise a protrusion engaged with the conductive particles.

3. The interconnect assembly of claim 1 wherein the through holes comprise non-moldable features.

4. The interconnect assembly of claim 1 wherein the through holes comprise one of a uniform or a non-uniform cross-sectional shape, along axis extending between the contact tips.

5. The interconnect assembly of claim 1 comprising a plurality of electrical devices printed onto the interconnect assembly and electrically coupled to at least one of the contact tips.

6. An electrical assembly comprising:

the interconnect assembly of claim 1;

a first circuit member comprising contact pads compressively engaged with distal ends of a plurality of first contact tips; and a second circuit member comprising contact pads compressively engaged with distal ends of a plurality of the second contact tips.

7. The interconnect assembly of claim 6 wherein the first and second circuit members are selected from one of a dielectric layer, a printed circuit board, a flexible circuit, a bare die device, an integrated circuit device, organic or inorganic substrates, or a rigid circuit.

8. The interconnect assembly of claim 1 comprises one or more circuitry planes printed on the interconnect assembly.

9. The interconnect assembly of claim 8 wherein conductive traces in the circuitry planes comprise substantially rectangular cross-sectional shapes.

10. The interconnect assembly of claim 1 comprising at least one covering layer printed to retain the contact tips to the resilient material.

11. The interconnect assembly of claim 1 wherein a resilient material is printed on the integrated circuit device with at least one through hole generally aligned with contact pads on the integrated circuit device.

12. A method of forming an interconnect assembly comprising: locating a plurality of first contact tips on a carrier; printing a resilient material on the carrier with a plurality of through holes generally aligned with the first contact tips; forming a plurality of recesses along at least one of the first and second surfaces corresponding to desired circuit traces; depositing a plurality of discrete, free-flowing conductive particles in the through holes, the conductive particles being free of binders or non-conductive materials; printing conductive material in at least a portion of the recesses comprising conductive traces electrically coupled to one or more of the contact tips; locating a plurality of second contact tips in the through holes adjacent a second surface; and separating the carrier from the first contact tips and the resilient material, wherein the first contact tips are solid and non-spherical and move in at least the pitch and roll directions relative to the interconnect assembly.

13. The method of claim 12 comprising the step of locating at least a portion of one or more of the contact tips in the through holes.

14. The method of claim 12 comprising printing the resilient material with one or more non-moldable features.

15. The method of claim 12 comprising displacing the contact tips in at least the pitch and roll directions relative to the interconnect assembly.

16. The method of claim 12 comprising:

printing a plurality of electrical devices on the interconnect assembly; and electrically coupling at least one of the electrical devices to at least one of the plurality of contact tips.

17. The method of claim 12 comprising:

compressively engaging contact pads on a first circuit member with distal ends of a plurality of first contact tips; and compressively engaging contact pads on a second circuit member with distal ends of a plurality of second contact tips.

18. The method of claim 17 wherein the first and second circuit members are selected from one of a dielectric layer, a printed circuit board, a flexible circuit, a bare die device, an integrated circuit device, organic or inorganic substrates, or a rigid circuit.

19. The method of claim 12 comprising printing one or more circuitry planes on the interconnect assembly.

20. The method of claim 12 comprising printing at least one covering layer to retain the contact tips to the resilient material.

* * * * *